United States Patent
Miyazaki

(10) Patent No.: US 9,379,199 B2
(45) Date of Patent: Jun. 28, 2016

(54) SEMICONDUCTOR DEVICE INCLUDING A CONTACT PLUG WITH BARRIER MATERIALS

(71) Applicant: Micron Technology, Inc., Boise, ID (US)

(72) Inventor: Tatsuya Miyazaki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/497,716

(22) Filed: Sep. 26, 2014

(65) Prior Publication Data
US 2015/0102491 A1    Apr. 16, 2015

(30) Foreign Application Priority Data
Oct. 16, 2013 (JP) .................. 2013-215300

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/45* | (2006.01) |
| *H01L 23/48* | (2006.01) |
| *H01L 21/8234* | (2006.01) |
| *H01L 21/8238* | (2006.01) |
| *H01L 27/088* | (2006.01) |
| *H01L 27/092* | (2006.01) |

(52) U.S. Cl.
CPC ........ *H01L 29/45* (2013.01); *H01L 21/823475* (2013.01); *H01L 21/823871* (2013.01); *H01L 23/481* (2013.01); *H01L 27/088* (2013.01); *H01L 27/092* (2013.01); *H01L 2924/0002* (2013.01)

(58) Field of Classification Search
CPC ............ H01L 29/4933; H01L 29/4941; H01L 29/665; H01L 29/78618
USPC .................................. 257/377, 382
See application file for complete search history.

(56) References Cited

U.S. PATENT DOCUMENTS

| | | | | |
|---|---|---|---|---|
| 2005/0042829 | A1* | 2/2005 | Kim | H01L 21/28556 438/268 |
| 2005/0142690 | A1* | 6/2005 | Lee | H01L 21/76814 438/72 |
| 2007/0269976 | A1* | 11/2007 | Futase | H01L 21/02063 438/637 |
| 2012/0032334 | A1* | 2/2012 | Lee | C23C 16/0272 257/770 |

FOREIGN PATENT DOCUMENTS

JP    2007-194468    8/2007

* cited by examiner

*Primary Examiner* — Hoai V Pham
(74) *Attorney, Agent, or Firm* — Wells St. John P.S.

(57) ABSTRACT

Disclosed herein is a semiconductor device that comprises a plug including an upper portion, a lower portion and a side surface and comprising tungsten, a barrier metal comprising tungsten nitride and covering the side surface and the lower portion of the contact plug, a conductive layer, and a barrier layer comprising titanium and intervening between the barrier metal and the first conductive layer.

16 Claims, 18 Drawing Sheets

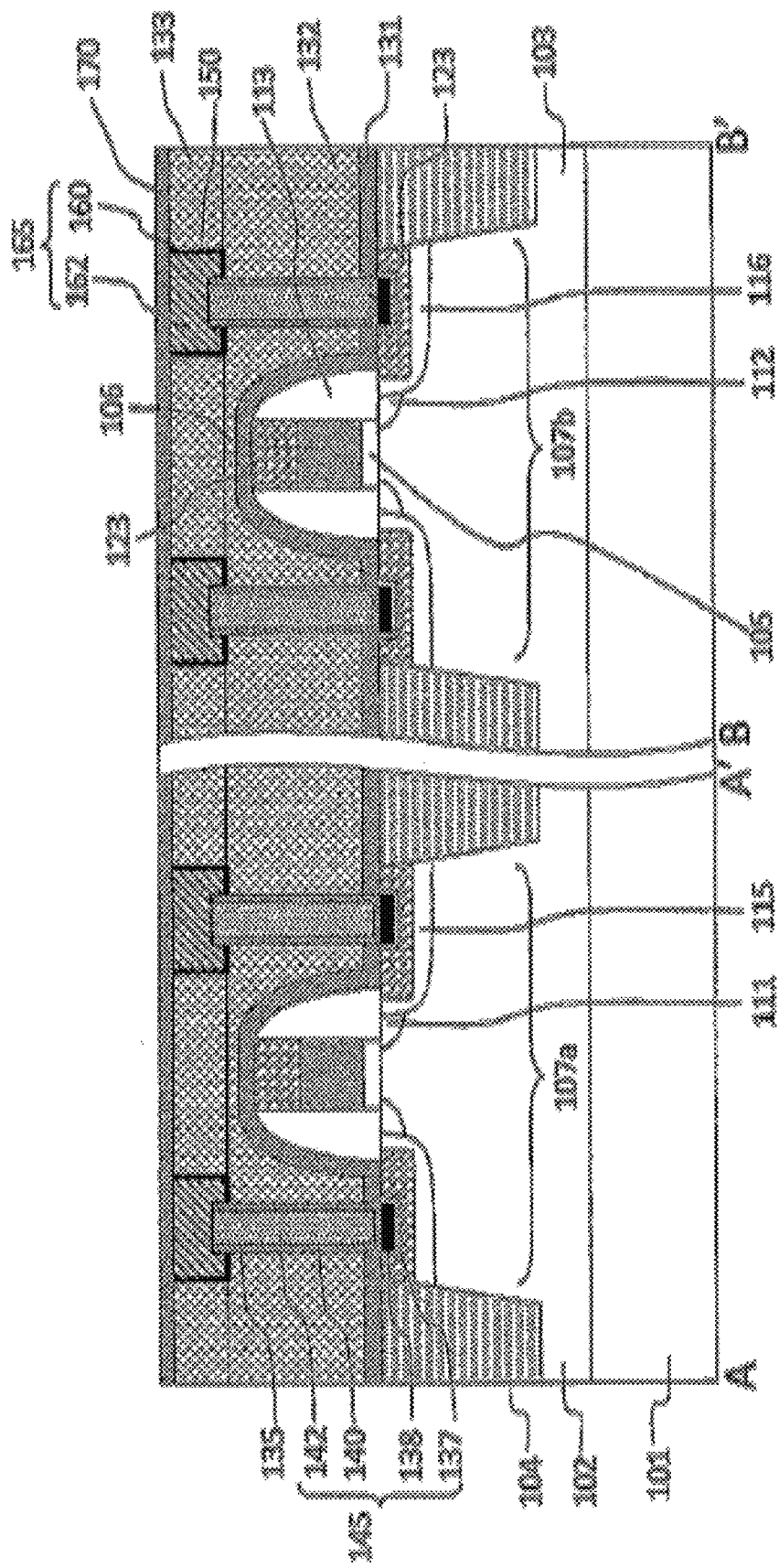

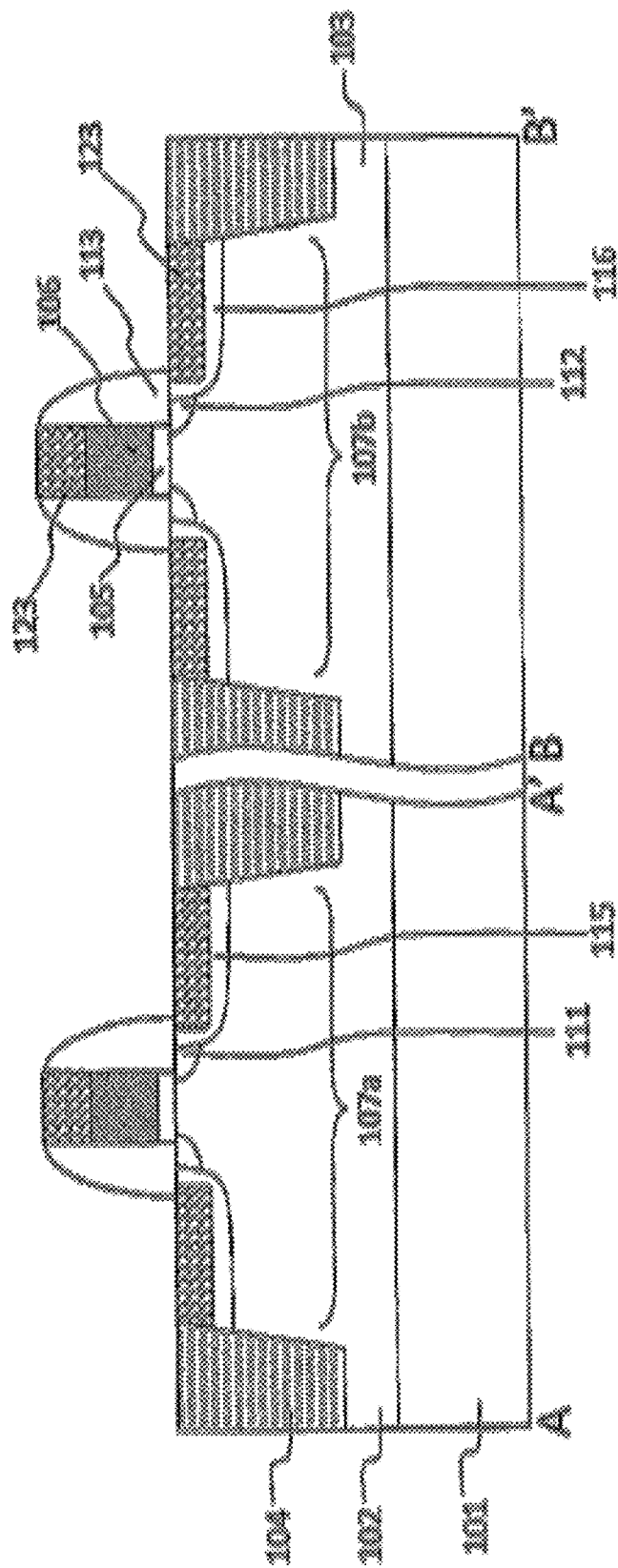

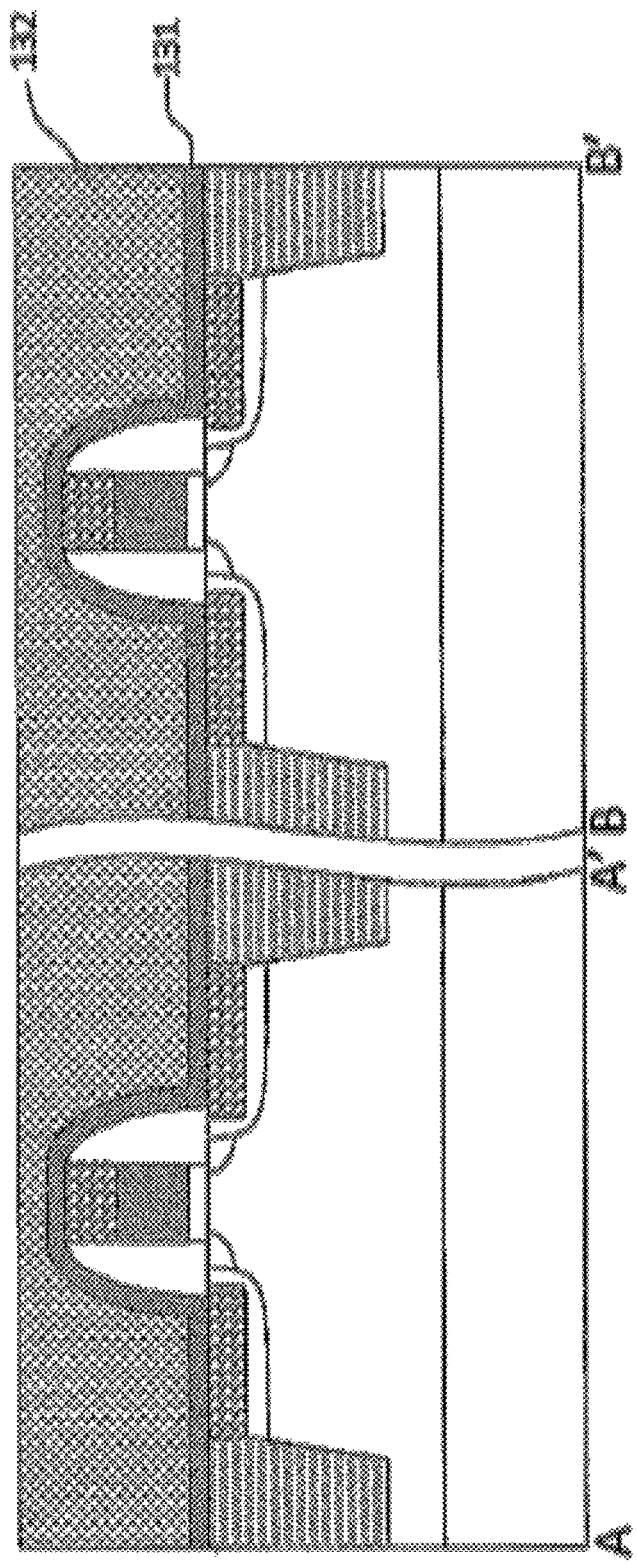

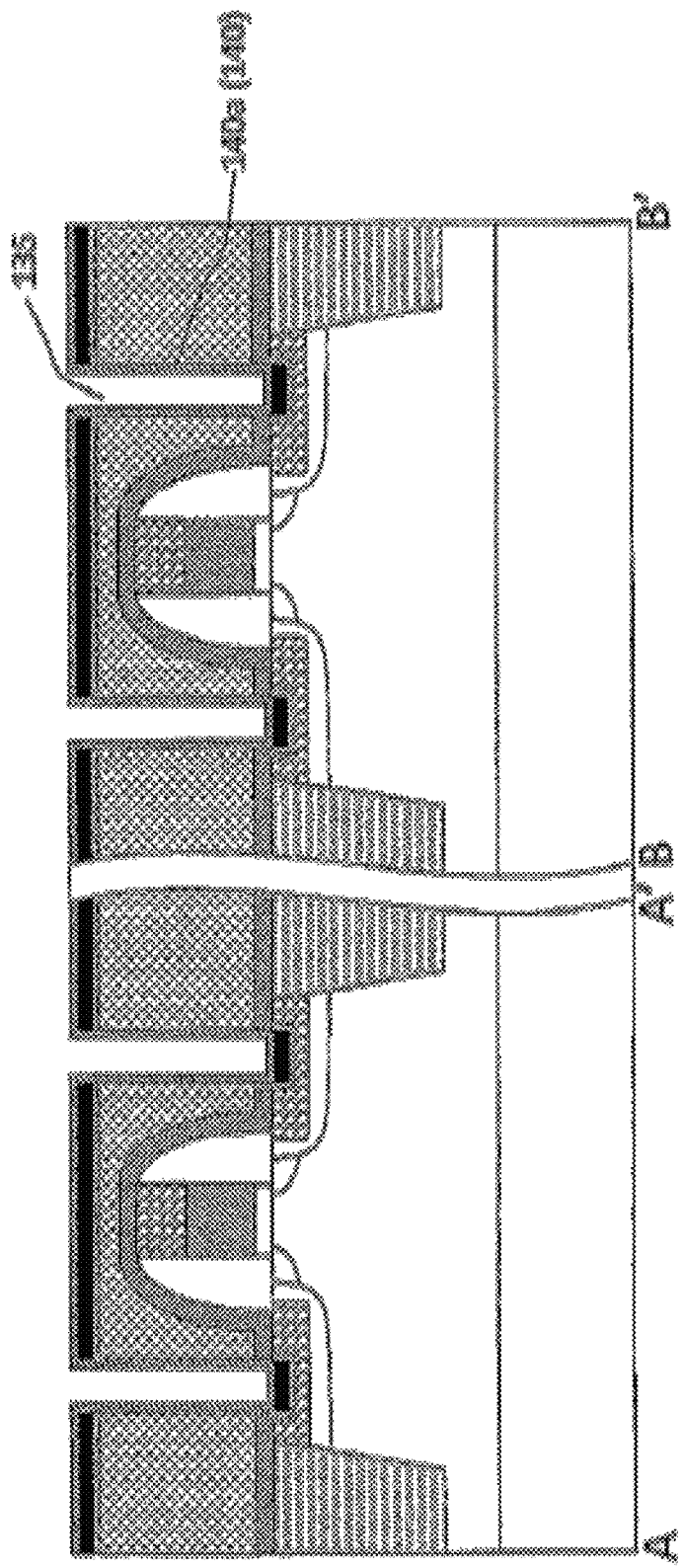

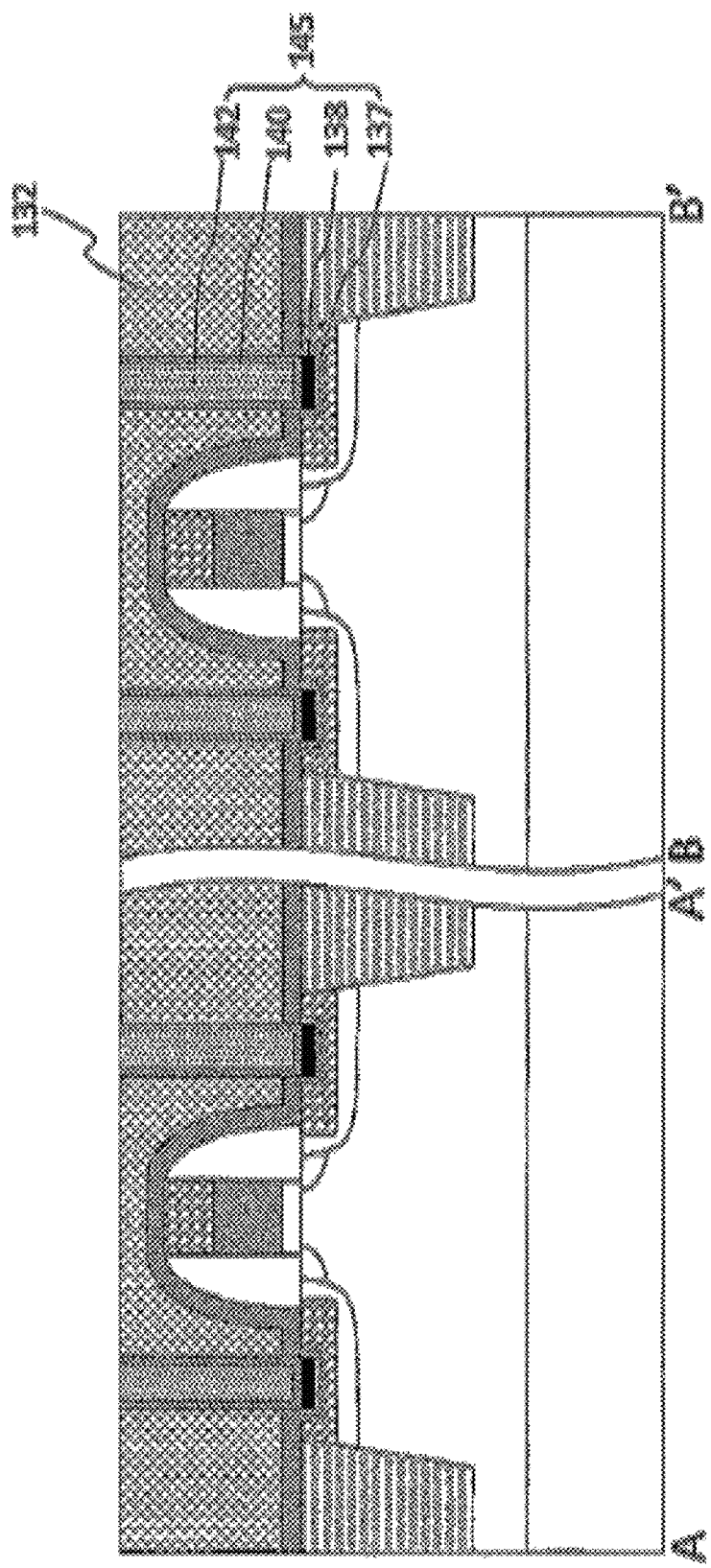

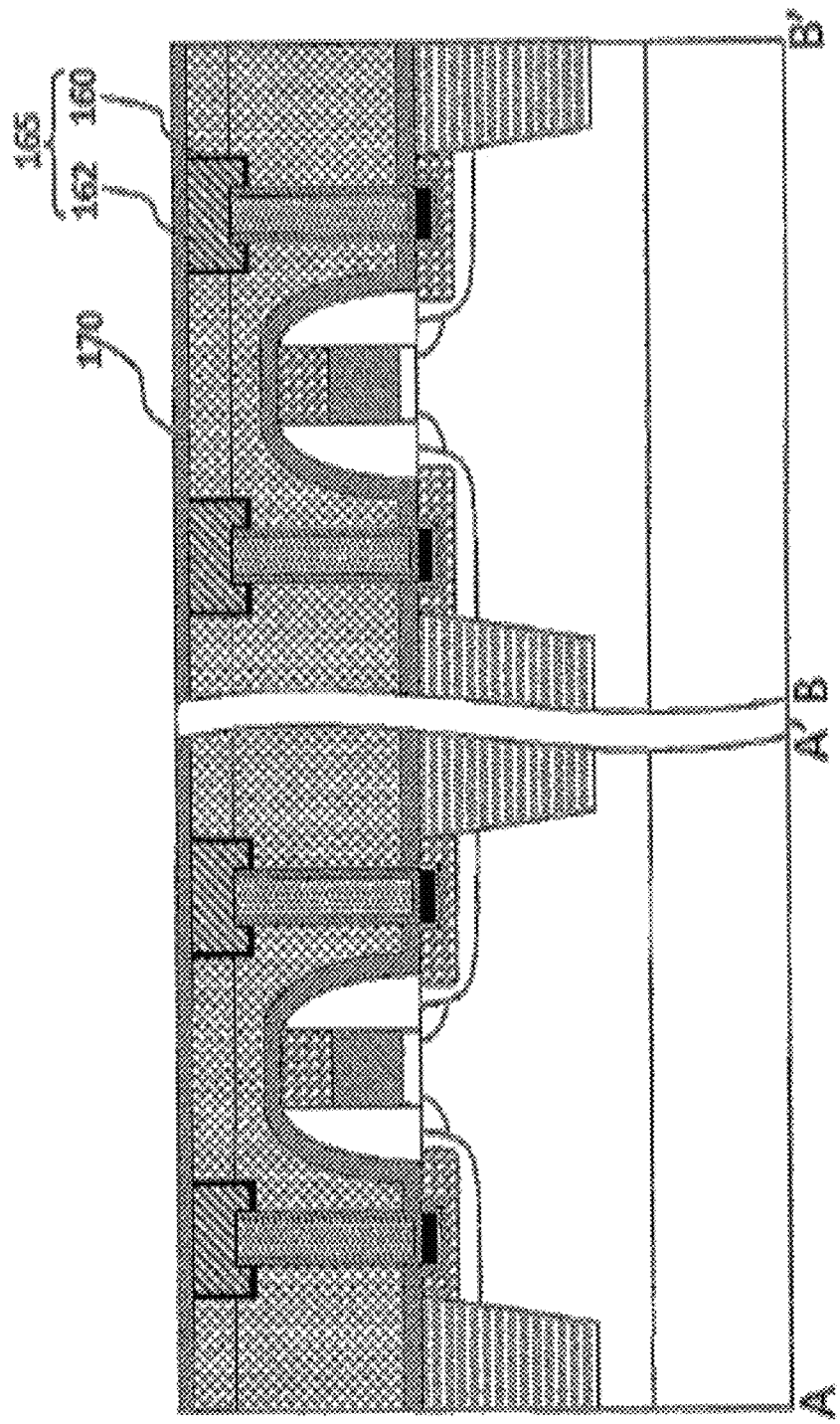

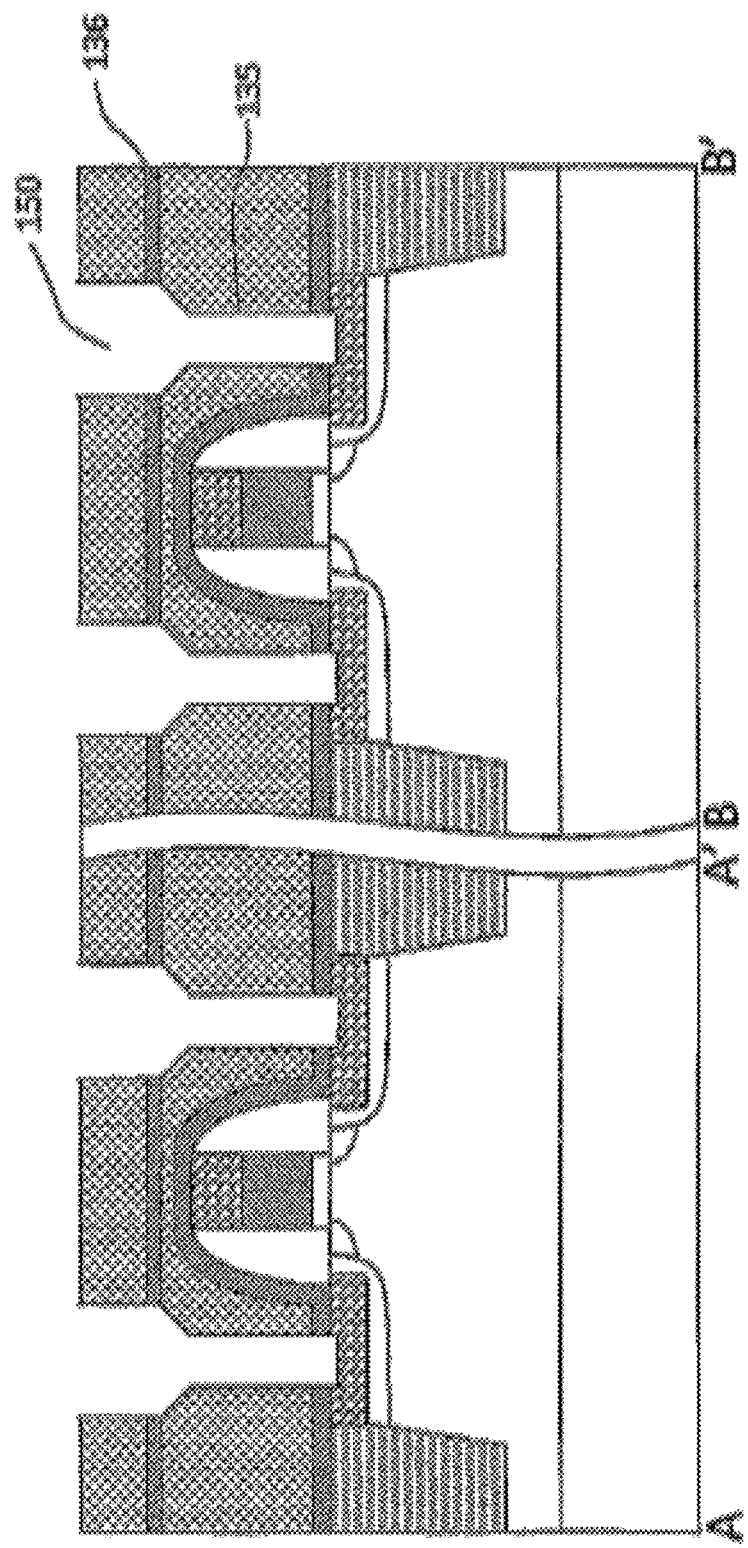

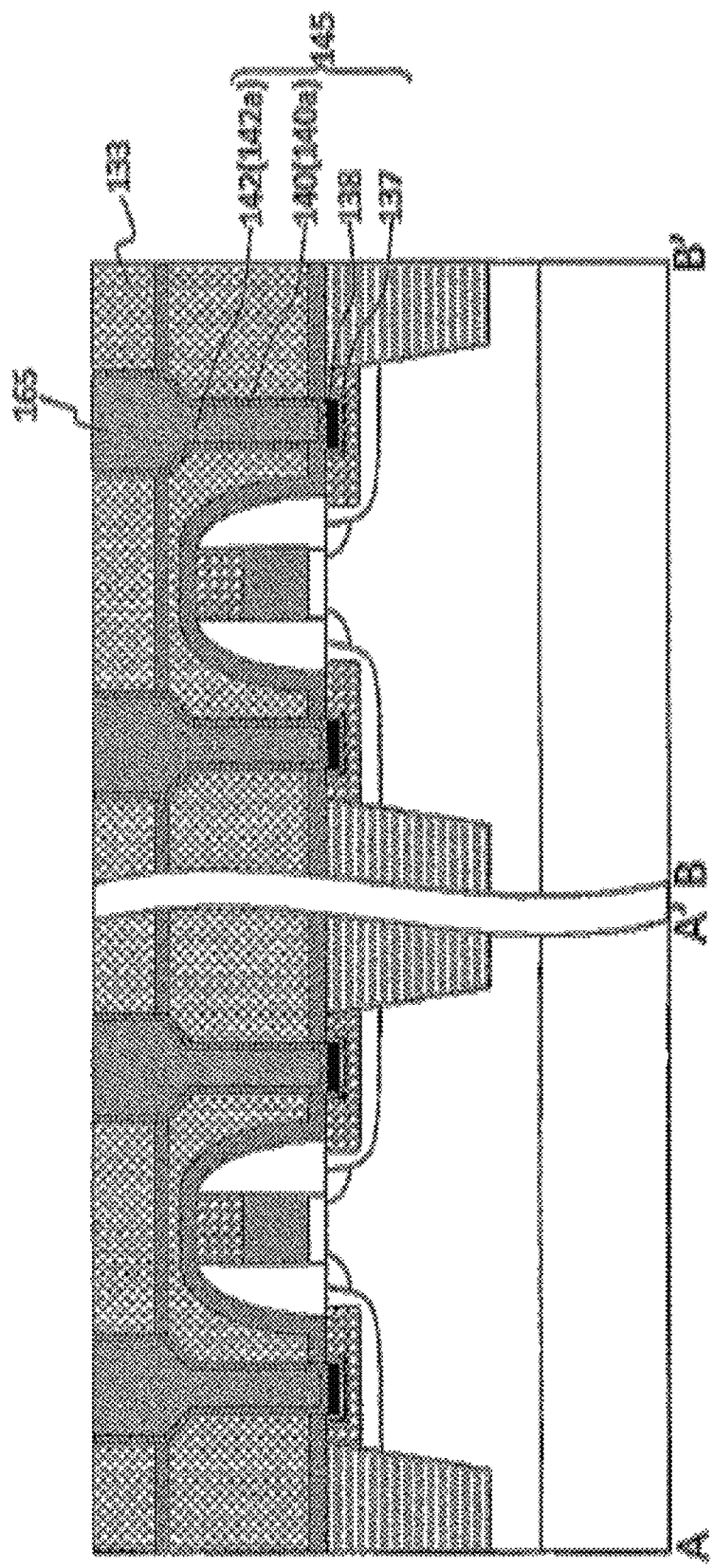

SEMICONDUCTOR DEVICE INCLUDING A CONTACT PLUG WITH BARRIER MATERIALS

This application is based upon and claims the benefit of priority from Japanese Patent Application No. 2013-215300 filed on Oct. 16, 2013, the disclosure of which are incorporated herein in its entirely by reference.

BACK GROUND

1. Field of the Invention

This invention relates to a semiconductor device, in particular, a semiconductor device including a contact plug with barrier materials.

2. Description of Prior Art

The related contact plug of the semiconductor device includes a barrier film that covers a bottom surface and a side wall surface of a contact hole and a contact plug main body that buries the inside thereof. The barrier film includes, for example, a stacked film of titanium film and titanium nitride film, or a stacked film of tungsten nitride film and tungsten film, and the contact plug main body is made of tungsten. See Japanese Patent Application Laid Open No. 2007-194468.

In order to realize further miniaturization and high integration of the semiconductor device, it is essential to shrink the diameter of the contact plug.

In order to form a contact plug by burying the contact hole having a small diameter, it is desirable to use a chemical vapor deposition method rather than a physical vapor deposition method from the viewpoint of a deposition phenomenon such as step coverage and the like.

However, the contact plug formed by a chemical vapor deposition method has a problem in that its adhesion to a lower conductor layer is poor and its electro-migration resistance is worse, in comparison with a contact plug formed by a physical vapor deposition method.

Moreover, the barrier layer forming the contact plug is required to have a film thickness of a predetermined film thickness or more so as to realize its functions; however, since it has a resistivity higher than that of the contact plug main body, its film thickness is desirably made thinner. For this reason, since the barrier layer is formed so as to have a minimum film thickness, it is difficult to further thinning the film thickness. Therefore, in an attempt to shrink the diameter of the contact plug, it is inevitably required to shrink the diameter of the contact plug main body. As a result, a problem is raised in that the shrinkage of the diameter of the contact plug causes an extreme increase in electric resistance.

Therefore, there have been strong demands for a semiconductor device provided with a contact plug whose diameter can be shrunk without causing degradation in reliability and whose electric resistance is lowered.

SUMMARY

The disclosure provides a semiconductor device a contact plug including an upper portion, a lower portion and a side surface interfacing the upper and lower portions with each other, the contact plug comprising tungsten, a barrier metal comprising tungsten nitride and covering the side surface and the lower portion of the contact plug, a first conductive layer, and a barrier layer comprising titanium and intervening between the barrier metal and the first conductive layer.

The disclosure further provides a semiconductor device a lower conductive layer, an insulating layer over the lower conductive layer, the insulating layer including a hole selectively formed therein to expose a part of the lower conductive layer, a contact plug formed in the hole, the contact plug comprising tungsten, a first barrier layer formed on the part of the lower conductive layer, a second barrier layer formed on the first barrier layer, and a barrier metal inserted between the second barrier layer and the contact plug.

The disclosure still further provides a semiconductor device a lower conductive layer including a first material, a barrier layer including a second material and contacting to the lower conductive layer, a barrier metal on the barrier layer, a contact plug on the barrier metal, and a compound material disposed between the lower conductive layer and the barrier layer, wherein the compound material includes the first and second materials.

BRIEF DESCRIPTION OF THE DRAWINGS

FIG. 2A is a cross-sectional view of the FIG. 1 along the line A-A'.

FIG. 2B is a cross-sectional view of the FIG. 1 along the line B-B'.

FIGS. 3A-11A are cross-sectional views of an embodiment of an intermediate semiconductor device structure of the present invention during various stages of fabrication shown in FIG. 1 along the line A-A'.

FIGS. 3B-11B are cross-sectional views of an embodiment of an intermediate semiconductor device structure of the present invention during various stages of fabrication shown in FIG. 1 along the line B-B'.

FIGS. 12A-16A are cross-sectional views of another embodiment of an intermediate semiconductor device structure of the present invention during various stages of fabrication shown in FIG. 1 along the line A-A'.

FIGS. 12B-16B are cross-sectional views of another embodiment of an intermediate semiconductor device structure of the present invention during various stages of fabrication shown in FIG. 1 along the line B-B'.

DETAILED DESCRIPTION OF THE EMBODIMENTS

Figure 1:
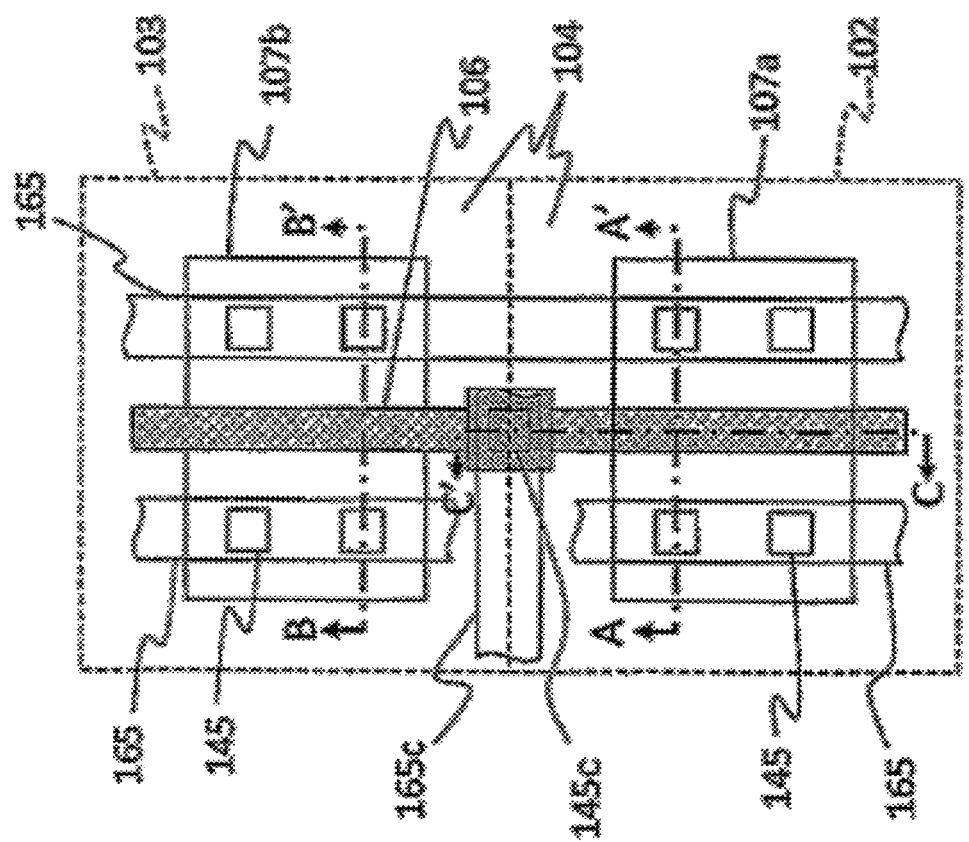
FIG. 1 is a top plan view of a semiconductor device structure in accordance with an embodiment of the present invention.

FIG. 1 shows a region in which a CMOS transistor is formed, which is included in a semiconductor device. In this region, a p-well 102 and an n-well 103 are included. In each of the p-well 102 and the n-well 103, active regions 107a and 107b, each surrounded by an isolation region 104 on its periphery, are specified. On the active regions 107a and 107b, an NMOS transistor and a PMOS transistor are respectively formed.

Gate electrodes 106 of the two transistors are connected each other. A contact plug 145c is connected to a center portion of the connected gate electrodes, and each of the gate electrodes is connected to the corresponding wiring 165c positioned on the upper layer (on the surface side of FIG.) through the contact plug 145c.

In each of the active regions 107a and 107b, a pair of source/drain regions is formed in a manner so as to sandwich the gate electrode 106. These source/drain regions are connected to the corresponding wirings 165 positioned on the upper layer through the respective contact plugs 145.

In accordance with FIGS. 2A and 2B, the two MOS transistors look as if they had the same structure. However, one of them is the NMOS transistor, and the other is the PMOS transistor.

In the center portion of each of the active regions 107a and 107b, a gate electrode 106 is formed with a gate insulating film 105 interposed therebetween. Moreover, in one of the active regions 107a, a pair of source/drain regions each including an n⁻ layer 111 and an n⁺ layer 115 are formed at positions sandwiching the gate electrode 106. In the same manner, in the other active region 107b, at positions sandwiching the gate electrode 106, a pair of source/drain layers including a p⁻ layer 112 and a p⁺ layer 116 are formed. Moreover, on the upper portions of the gate electrode 106 and the respective source/drain layers, respective metal silicide layers 123 are formed. Furthermore, a side wall spacer 113 is formed in a manner so as to cover the gate electrode 106 and side surfaces of the metal silicide layers 123 formed on the upper portion thereof.

First, second and third insulating layers 131, 132 and 133 are formed in a manner so as to cover the entire surface of the semiconductor (silicon) substrate 101 on which the MOS transistor is formed. Inside a contact hole 135 formed so as to penetrate the first and second insulating layers 131 and 132 to reach the metal silicide layer 123 of the source/drain region, a contact plug 145 includes first and second bottom barrier layers 137 and 138, a barrier metal 140 and a contact plug main body 142 is formed The contact plug main body 142, which is made of tungsten or an alloy (for example, containing boron) comprising tungsten, has an upper portion, a bottom portion and side surface portions that continue to these portions.

The barrier metal 140, which is made of, for example, tungsten nitride, covers the bottom portion and the side surface portions of the contact plug main body 142. The barrier metal 140, which is directly made in contact with the second insulating layer 132 on the periphery thereof, separates the contact plug main body 142 from the second insulating layer 132.

The first bottom barrier layer 137 comprises, for example, titanium, covers the metal silicide layer 123 exposed to the contact hole. The second bottom barrier layer 138, which is made of, for example, titanium nitride, covers the first bottom barrier layer 137. The second bottom barrier layer 138 is made face to face with the bottom portion of the contact plug main body 142, with the barrier metal 140 interposed therebetween.

The contact plug main body 142 is electrically connected to the metal silicide layer 123 serving as the lower conductive layer, with the barrier metal 140, the second bottom barrier layer 138 and the first bottom barrier layer 137 interposed therebetween.

Inside a wiring groove 150 formed by removing a part of the third insulating layer 133, a wiring 165 includes a wiring barrier layer 160 and a wiring metal layer 162 is formed. The upper portion of the contact plug 145 is connected to the wiring 165. The upper surface of the wiring 165 is covered with a protective insulating film 170 formed in a manner so as to cover the upper surface of the third interlayer film 133.

Figure 2C:
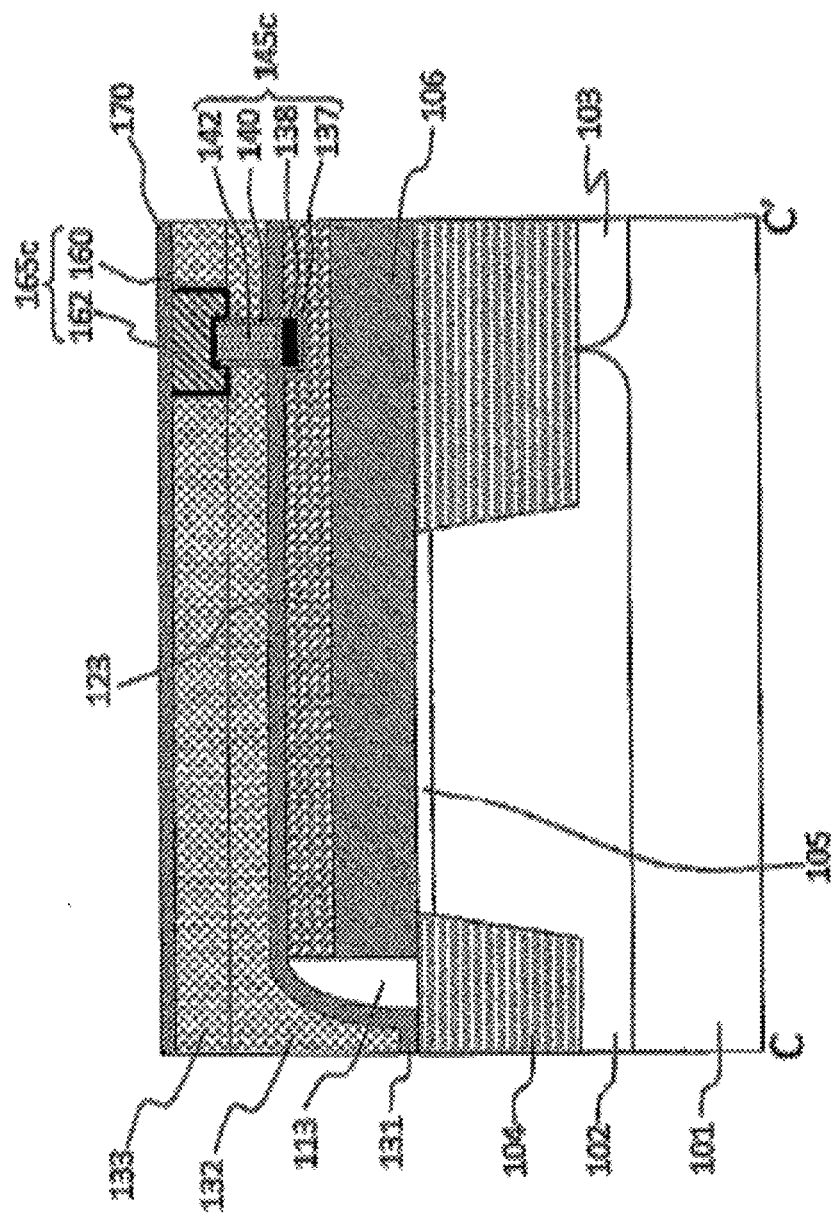
FIG. 2C is a cross-sectional view of the FIG. 1 along the line C-C'.

Upon reference to FIG. 2C, in the same manner as in the source/drain region, the gate electrode 106 is also connected to a wiring 165c includes a wiring barrier layer 160 and a wiring metal layer 162, with a contact plug 145c includes the first and second bottom barrier layers 137 and 138, the barrier metal 140 and the contact plug main body 142, interposed therebetween.

The semiconductor device relating to the present embodiment is characterized by a structure having a bottom barrier layer formed on the lower portion of the contact plug 145 in addition to the barrier metal 140. The bottom barrier layer has a two layer structure having the first bottom barrier layer 137 made in contact with the metal silicide layer 123 serving as the lower conductive layer and the second bottom barrier layer 138 made in contact with the barrier metal 140. The first bottom barrier layer 137 comprises, for example, titanium, and the second bottom barrier layer 138 comprises, for example, titanium nitride.

As described above, in the present embodiment, in addition to the barrier metal 140, the bottom barrier layer is formed on the lower end portion of the contact plug 145. By forming the bottom barrier layer by using a PVD (Physical Vapor Deposition) method, it is possible to enhance the adhesion of the contact plug 145 onto the metal silicide layer 123 serving as the lower conductive layer, and consequently to ensure reliability as the semiconductor device. Moreover, the existence of the bottom barrier layer makes it possible to exert functions required as the barrier film even when the film thickness of the barrier metal 140 is thinned. As a result, the diameter of the contact plug main body 142 can be enlarged so that the electric resistance of the contact plug 145 can be lowered. Thus, even when the diameter of the contact plug 145 is shrunk, it becomes possible to suppress an increase in electric resistance without causing degradation of reliability.

Referring to FIG. 3 to FIG. 11, the following description will discuss a method for manufacturing the semiconductor device shown in FIG. 1 and FIG. 2. FIGS. 3A to 11A as well as FIGS. 3B to 11B are cross-sectional views of an embodiment of an intermediate semiconductor device structure of the present invention during various stages of fabrication shown in FIG. 1 along line A-A' and line B-B' of FIG. 1.

First, FIGS. 3A and 3B are referred to. A semiconductor (silicon) substrate 101 is prepared, and an isolation region (STI) 104 is formed on one surface side. By forming the isolation region 104, the active regions 107a and 107b are partitioned. Additionally, in the following description, the silicon substrate 101 and the structures formed thereon may be collectively referred to as a wafer in some cases.

Next, by ion-implanting a p-type impurity, for example, boron to one of the active regions 107a, a p-type well 102 is formed. Successively, by ion-implanting an n-type impurity, for example, phosphorus to the other active region 107b, an n-type well 103 is formed. Moreover, if necessary, an impurity for use in forming a channel stopper layer may be ion-implanted in the vicinity of the bottom portion of the isolation region 104, or an impurity for use in adjusting a threshold voltage may be ion-implanted in the vicinity of the surface of the silicon substrate 101.

Next, an insulating film to be formed into a gate insulating film and a gate electrode film (polycrystalline silicon film) are stacked so as to cover the entire surface of the wafer. By using a photolithography technique, the insulating film and the gate electrode film are fabricated into desired patterns so that the gate insulating film 105 and the gate electrode 106 are formed.

Next, by ion-implanting an n-type impurity, for example, arsenic to the p-type well 102, the n⁻ layer 111 serving as a shallow impurity diffused layer is formed. Moreover, by ion-implanting a p-type impurity, for example, boron to the n-type well 103, the p⁻ layer 112 serving as a shallow impurity diffused layer is formed. At this time, in addition to the formations of the n⁻ layer 111 and the p⁻ layer 112, a halo implantation may be carried out so as to control a short-channel effect.

Next, a silicon oxide film that covers the entire wafer surface is formed, and the silicon oxide film thus formed is etched back by an anisotropic dry etching process so that a side wall spacer 113 is formed.

Next, by ion-implanting an n-type impurity, for example, arsenic into the p-type well 102 as well as by ion-implanting a p-type impurity, for example, $BF_2$ into the n-type well 103, the n⁺ layer 115 and the p⁺ layer 116 serving as deep impurity diffused layers are respectively formed. Thereafter, the wafer is performed to a thermal treatment so that the impurities diffused into the n⁺ layer 115 and the p⁺ layer 116 are activated so as to function as the source/drain region.

Next, a nickel film is formed on the entire wafer surface by using a PVD method, and the wafer is performed to a thermal treatment so as to allow the nickel film thus formed to react with silicon located beneath the nickel film (to be silicided). As a result, the nickel film is silicided at a region where it is made in contact with silicon. Then, the unreacted nickel film is selectively removed by wet etching. Thus, the metal (nickel) silicide layers 123 are formed on upper portions of the respective n⁺ layer 115, the p⁺ layer 116 and the gate electrode 106, each corresponding to one portion of the source/drain region, in a self-aligned manner.

Additionally, in the present embodiment, nickel silicide is formed as the metal silicide layer; however, a metal silicide layer containing at least one of nickel, titanium, cobalt and platinum, may be formed.

Next, as shown in FIG. 4A and FIG. 4B, the first insulating layer 131 (for example, silicon nitride film) and the second insulating layer 132 (for example, layer comprising silicon dioxide) are successively formed on the entire wafer surface. Then, the upper surface of the second insulating layer 132 is planerized by using a CMP (Chemical Mechanical Polish) method.

Figures 5A, 5B:
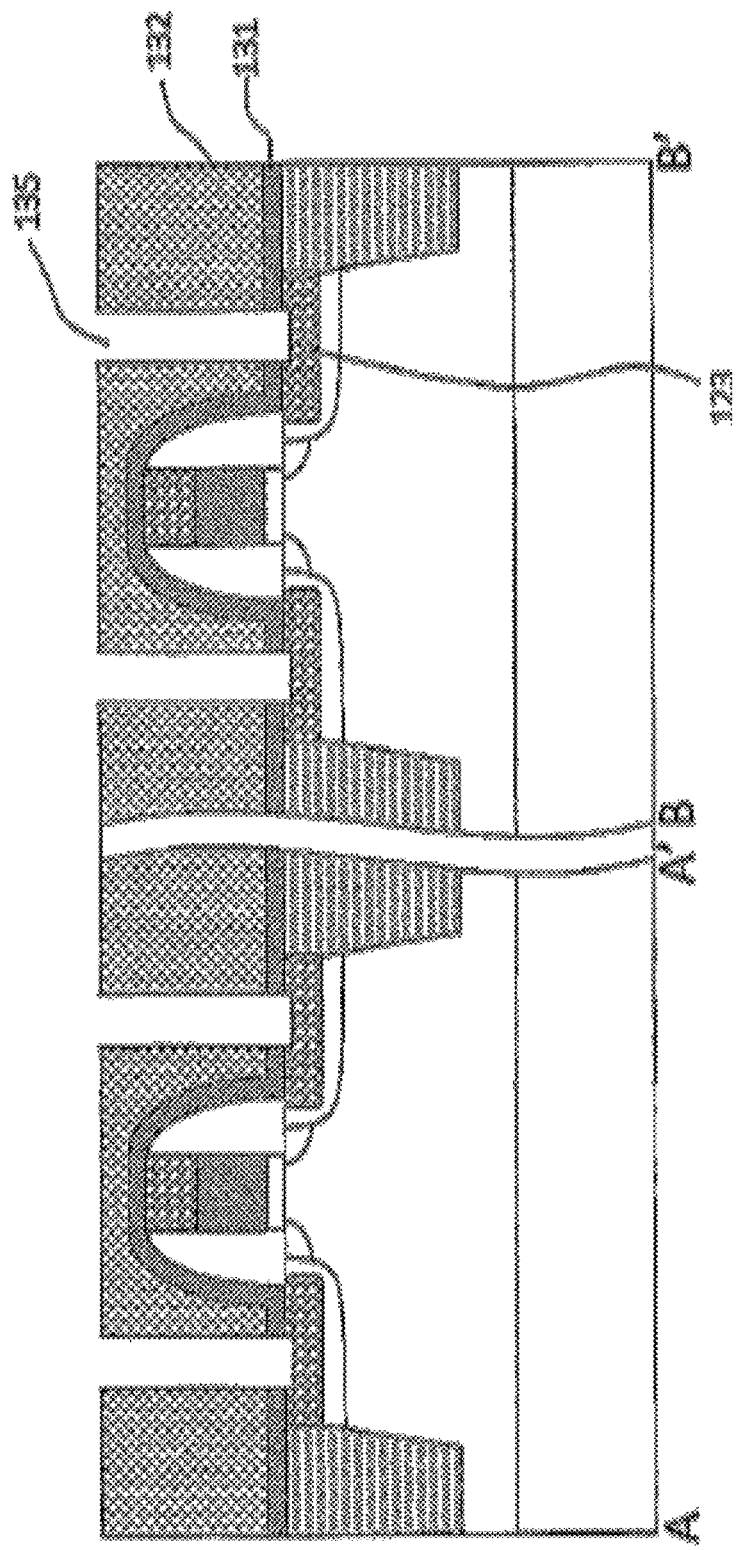

Next, as shown in FIG. 5A and FIG. 5B, by using a photolithography technique, a contact hole 135 that penetrates the first insulating layer 131 from the second insulating layer 132 to reach the metal silicide layer 123 is opened. The contact hole 135 is formed in a manner so as to expose not only one portion of the metal silicide layer 123 formed on the source/drain region, but also one portion of the metal silicide layer 123 (see FIG. 2C) formed on the gate electrode 106. Additionally, the formation of the contact hole 135 may be carried out so as to form a concave portion on the metal silicide layer 123, as shown in the FIG.

Figures 6A, 6B:
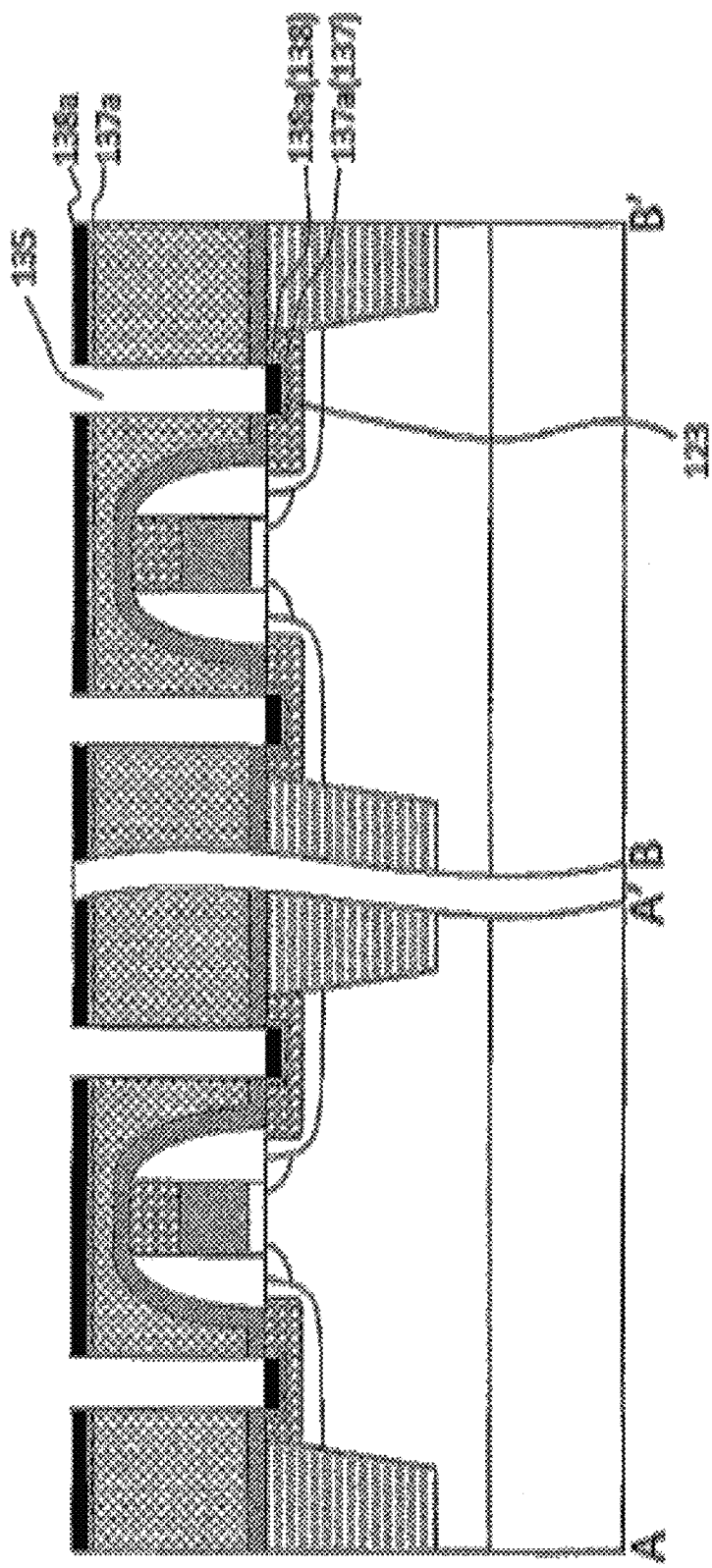

Next, as shown in FIG. 6A and FIG. 6B, by using a PVD method, first bottom barrier film 137a and second bottom barrier film 138a to be formed into the first bottom barrier layer 137 and the second bottom barrier layer 138 are successively formed. The first bottom barrier film 137a is formed in a manner so as to cover at least the exposed surface of the metal silicide layer 123 exposed to the bottom portion of the contact hole 135. Moreover, the second bottom barrier film 138a is formed in a manner so as to cover and conceal at least first bottom barrier film 137a formed inside the contact hole 135. As the first bottom barrier film 137a, for example, titanium film may be used, and as the second bottom barrier film 138a, for example, titanium nitride film may be used. Since the metal silicide layer 123 has a comparatively low thermal stability, the deposition processes of the first bottom barrier film 137a and the second bottom barrier film 138a also need to be carried out at a comparatively low temperature.

The reason that the PVD method is used for forming the first bottom barrier film 137a and the second bottom barrier film 138a is because an attempt is made to allow the first bottom barrier film 137a to have high adhesion to the metal silicide layer 123 exposed to the bottom portion of the contact hole 135.

Moreover, upon forming the first bottom barrier film 137a and the second bottom barrier film 138a, among the PVD methods, a long-throw sputtering method is preferably used. This method, is used because the film formation onto the bottom portion of the contact hole 135 can be carried out desirably and because the film formation onto the side wall of the contact hole 135 can be suppressed.

Additionally, upon forming the first bottom barrier film 137a and the second bottom barrier film 138a, a CVD (Chemical Vapor Deposition) method, an MOCVD (Metal Organic Chemical Vapor Deposition) method or an ALD (Atomic Layer Deposition) method may be used. In this case, however, the corresponding process needs to be carried out so as to minimize the film thickness of the second bottom barrier film 138a to be formed on the side wall of the contact hole 135. This is because titanium nitride film to be used as the second bottom barrier film 138a has a comparatively high electric resistivity.

Next, as shown in FIG. 7A and FIG. 7B, a barrier metal film 140a to be formed into the barrier metal 140 is formed by using the ALD method so as to cover at least the bottom portion and side wall portions of the contact hole 135. As the barrier metal film 140a, for example, tungsten nitride film may be used.

Figures 8A, 8B:
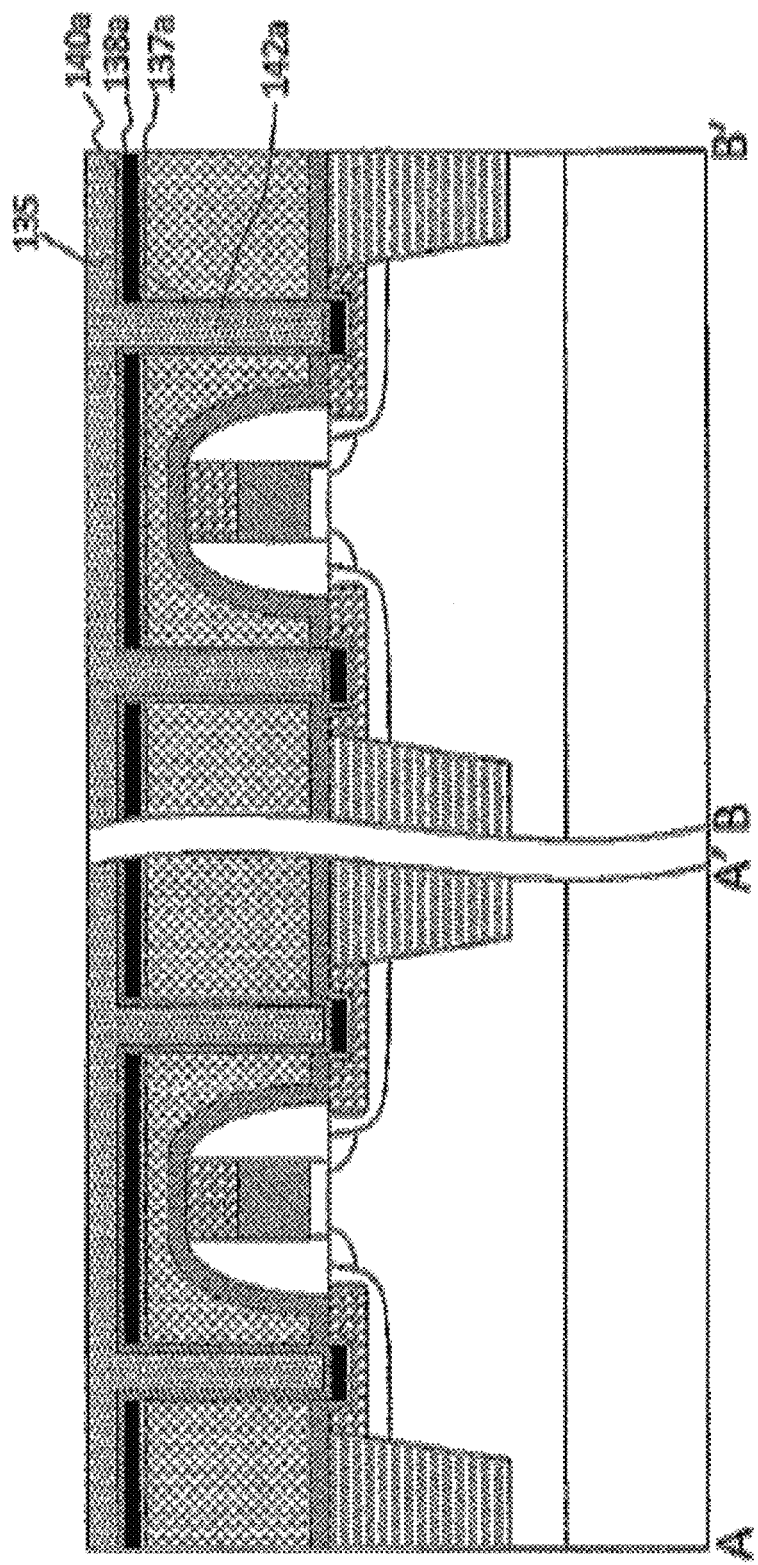

Next, as shown in FIG. 8A and FIG. 8B, by using a CVD method, a tungsten film 142a to be formed into the contact plug main body 142 is formed in a manner so as to bury the contact hole 135. Upon forming the tungsten film 142a, first, tungsten hexafluoride is reduced by diborane to thinly carry out a nucleation process, and by changing the reduction gas to hydrogen, a thick tungsten film is then formed.

Next, as shown in FIG. 9A and FIG. 9B, the tungsten film. 142a, the barrier metal film 140a, the second bottom barrier film 138a and the first bottom barrier film 137a, formed on the second insulating layer 132, are polished and removed by using a CMP method. Thus, the contact plug 145, includes the first bottom barrier layer 137, the second bottom, barrier layer 138, the barrier metal 140 and the contact plug main body 142, is formed inside the contact hole 135.

Figures 10A, 10B:
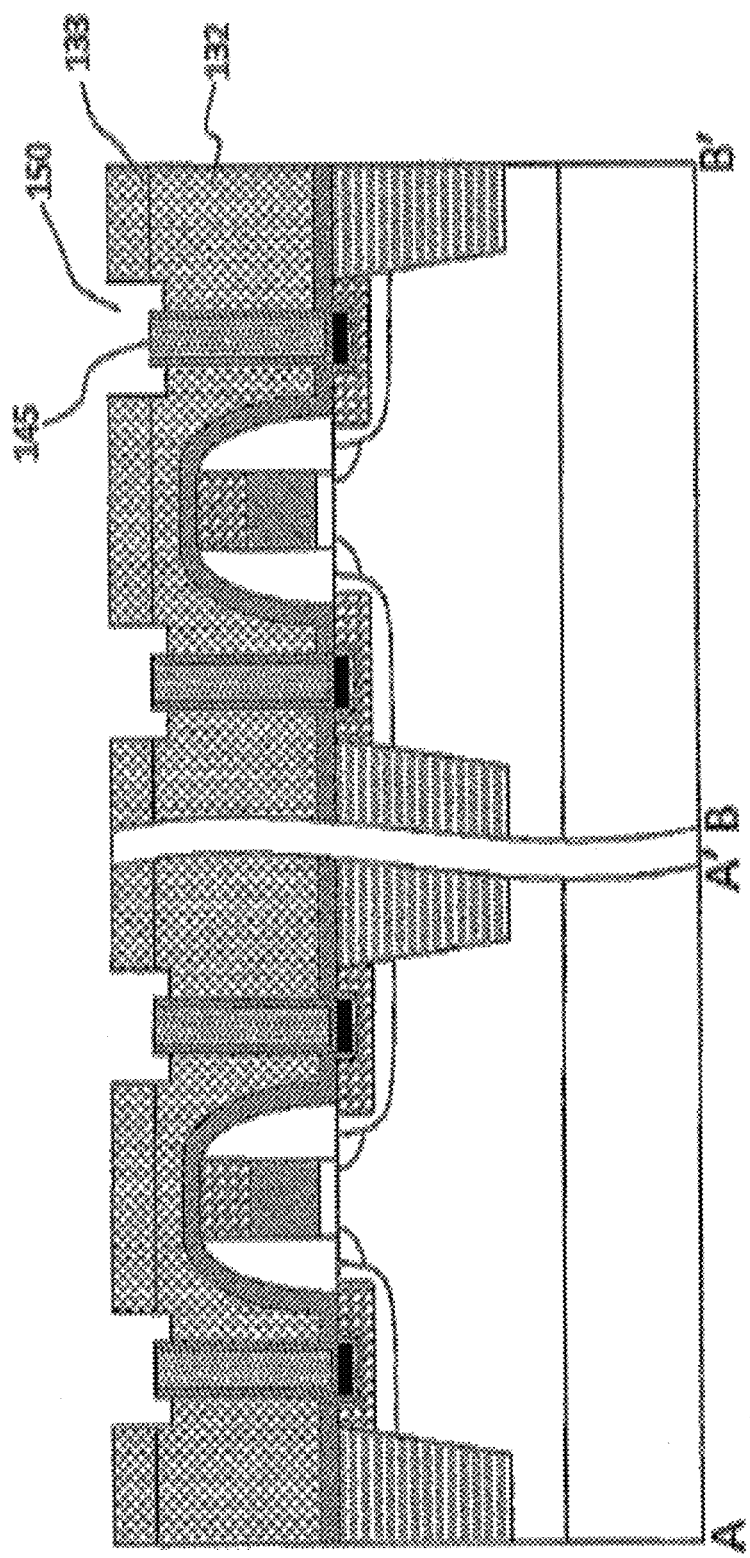

Next, as shown in FIG. 10A and FIG. 10B, a third insulating layer 133 (for example, a layer comprising silicon dioxide) for covering the upper surface of the contact plug 145 is formed on the second insulating layer 132. Then, by using a photolithography technique, wiring grooves 150 having a desired layout pattern are formed on the third insulating layer 133. The formation of the wiring grooves 150 is carried out by removing one portion of the second insulating layer 132 in a manner so as to expose the upper portion of the contact plug 145.

Next, as shown in FIG. 11A and FIG. 11B, a wiring 165 includes a wiring barrier layer 160 and a wiring metal layer 162 is formed inside each of the wiring grooves 150. The wiring barrier layer 160 and the wiring metal layer 162 are formed in the following manner; first, a barrier metal film (for example, a stacked film of tantalum film and tantalum nitride film) to be formed into the wiring barrier layer 160 is formed by using a PVD method or the like, and by using a plating method or the like, a wiring metal film (for example, copper film) to be formed into the wiring metal layer 162 is successively formed in a manner so as to bury the wiring groove 150. Then, excessive wiring metal film and barrier metal film formed on the third insulating layer 133 are polished and removed by using a CMP method. Thus, the wiring 165 includes the wiring barrier layer 160 and the wiring metal layer 162 is formed inside each of the wiring grooves 150.

Lastly, a protective insulating film 170 is formed on the entire wafer surface so as to cover and protect the upper surface of the wiring 165. As the protective insulating film 170, for example, silicon carbonitride film may be used, and the formation thereof may be carried out by using, for example, a CVD method.

As described above, a semiconductor device shown in FIG. 1 and FIG. 2 is completed.

In the present embodiment, since the first bottom barrier layer 137 is formed by using the PVD method, the first bottom barrier layer 137 is allowed to have high adhesion to the silicide layer. Therefore, the contact plug 145 is superior in EM resistance, and the semiconductor device has high reliability.

Moreover, since the first bottom barrier layer 137 and the second bottom barrier layer 138 are present, its functions can be exerted even when the film thickness of the barrier metal 140 is made thinner. Therefore, the diameter of the contact plug main body 142 can be made larger in comparison with the structure having neither the first bottom barrier layer 137 nor the second bottom barrier layer 138 so that the electric resistance can be lowered. As a result, it becomes possible to suppress an increase in electric resistance even when the diameter of the contact plug 145 is further shrunk.

Next, referring to FIG. 12 to FIG. 16, the following description will discuss a semiconductor device relating to a second embodiment of the present invention. Additionally, in the respective Figs., those elements that are the same as, or similar to those of the first embodiment are indicated by the same reference numerals.

First, by using the same processes as those of the first embodiment, the processes up to the planerization of the second insulating layer 132, as shown in FIG. 4A and FIG. 4B, are carried out.

Figures 12A, 12B:
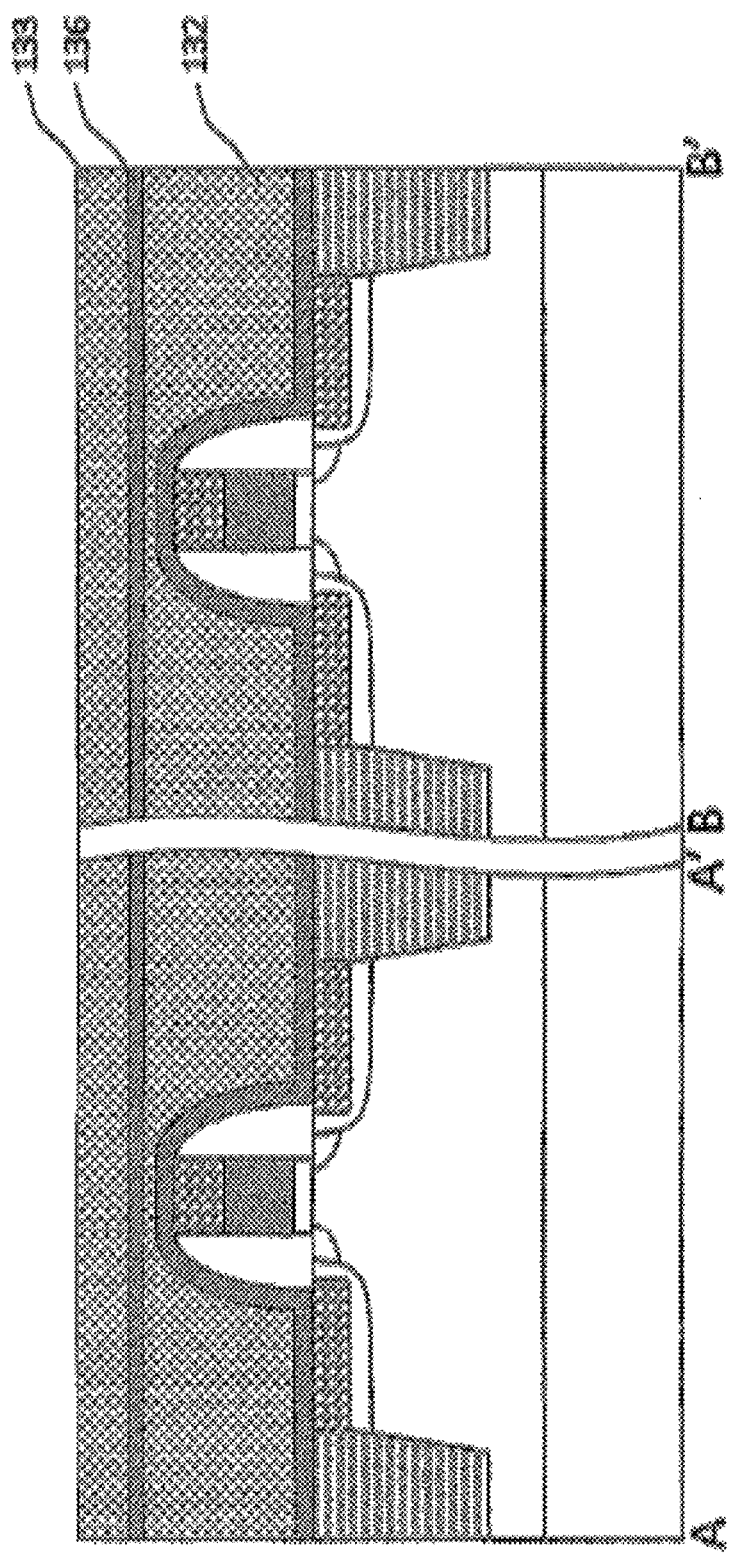

Next, as shown in FIG. 12A and FIG. 12B, an etching stopper 136 and a third insulating film 133 are successively formed on the flattened second insulating layer 132. The etching stopper layer 136 is, for example, silicon nitride film, and the third insulating film 133 is, for example, silicon dioxide film.

Figures 13A, 13B:
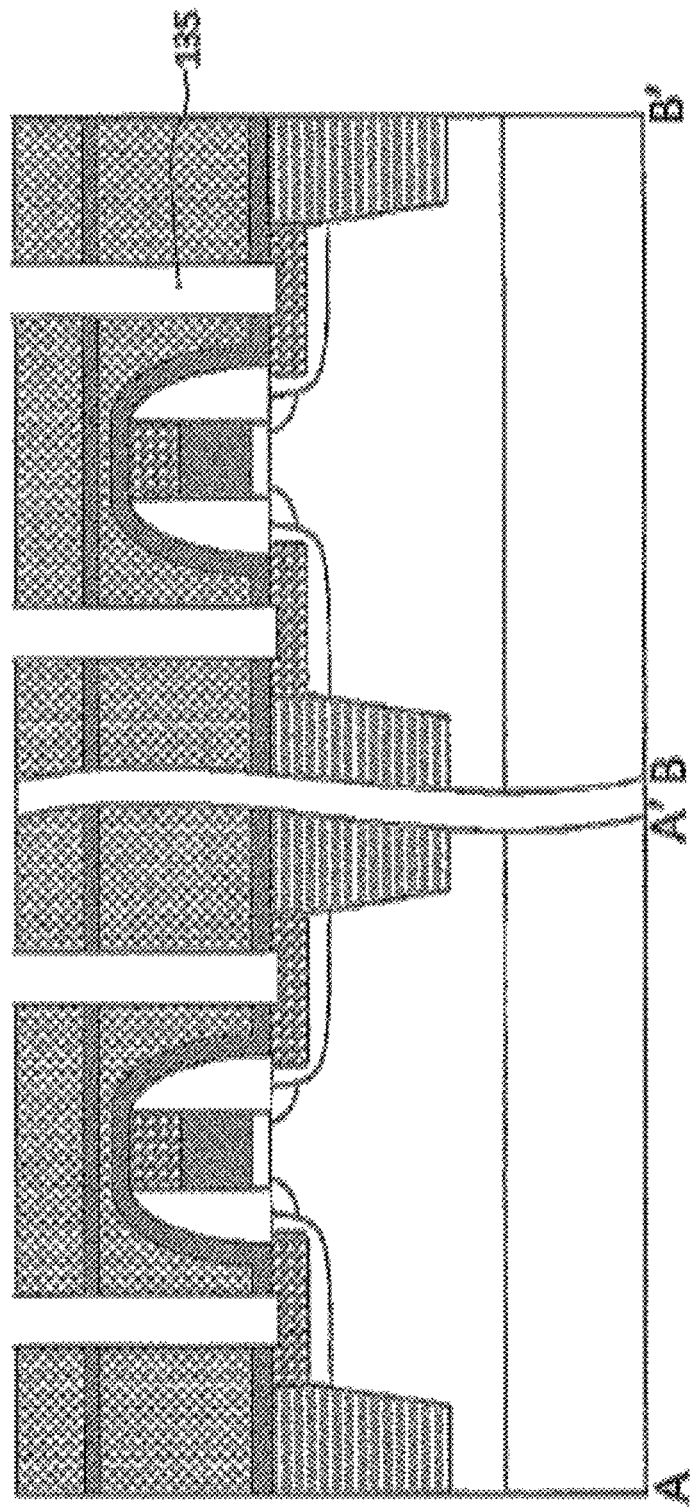

Next, as shown in FIG. 13A and FIG. 13B, a contact hole 135 that penetrates the third insulating layer 133, the etching stopper 136, the second insulating layer 132 and the first insulating layer 131 to reach the metal silicide layer 123 is opened. In the same manner as in the first embodiment, the opening process of the contact hole 135 may be carried out so as to form a concave portion on the metal silicide layer 123. Moreover, the contact hole 135 that reaches the metal silicide layer 123 on the gate electrode is simultaneously opened.

Next, as shown in FIG. 14A and FIG. 14B, wiring grooves 150 are formed on the third insulating layer 133 with a predetermined layout pattern. The formation of the wiring grooves 150 is carried out in the following manner; first, by using a photolithography method and a dry etching method, one portion of the third insulating layer 133 is removed with a desired layout pattern so that one portion of the upper surface of the etching stopper 136 is exposed. Successively, the exposed etching stopper 136 is removed by using a dry etching method. At this time, one portion of the second insulating layer 132 positioned on the periphery of the opening of the contact hole 135 is also etched so that the cross-sectional shape in the vicinity of the opening of the contact hole 135 has a tapered shape.

Figures 15A, 15B:
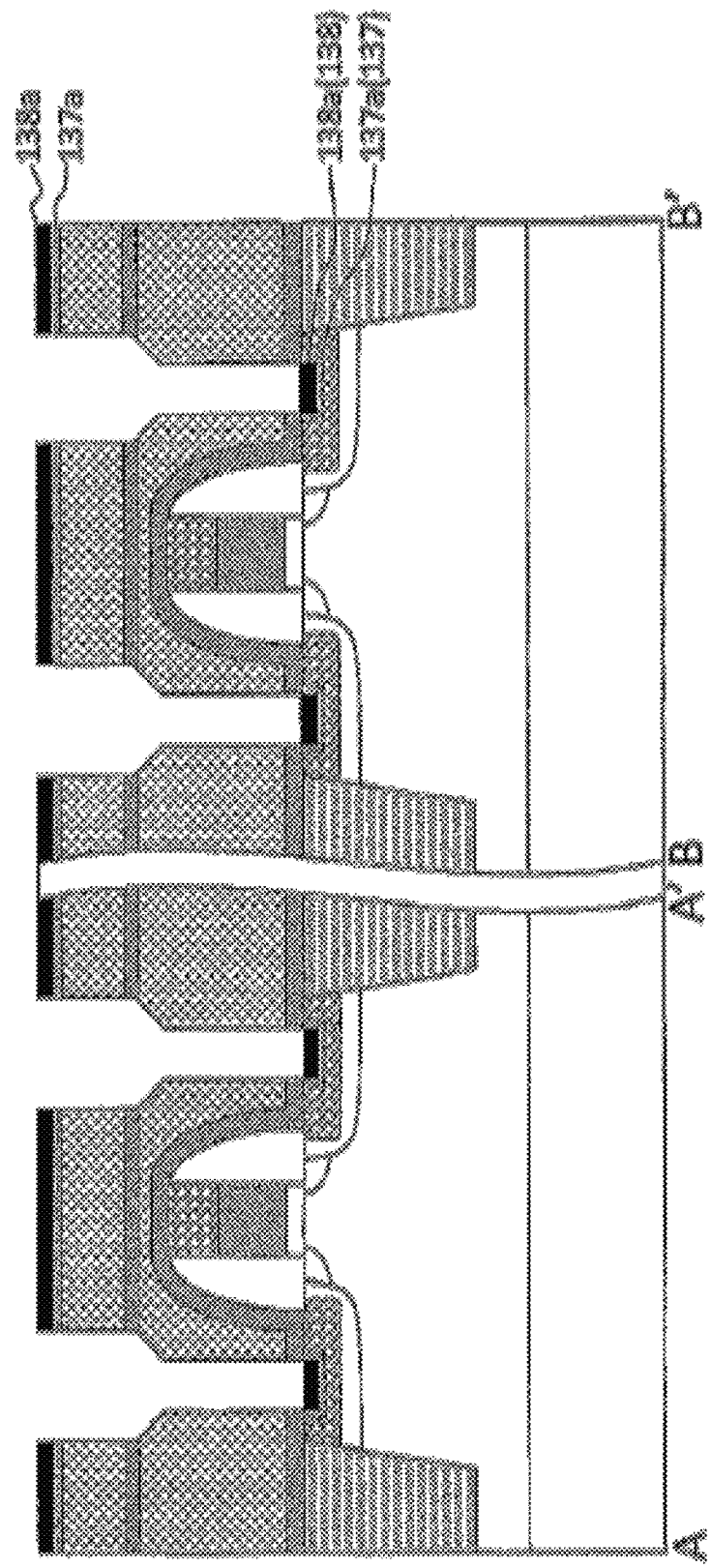

Next, as shown in FIG. 15A and FIG. 15B, by using the PVD method, preferably, the long and slow sputtering method, in the same manner as in the first embodiment, a first bottom barrier film 137a and a second bottom barrier film 138a are successively formed.

Next, as shown in FIG. 16A and FIG. 16B, by using the ALD method in the same manner as in the first embodiment, a barrier metal film 140a is formed in a manner so as to cover at least the bottom (second bottom barrier film 138a) and the side wall of the contact hole 135 as well as the slanting surface and the side wall of each of the wiring grooves 150. Next, by using a sputtering method, a tungsten film 142a is formed in a manner so as to bury the contact hole 135 and each of the wiring grooves 150. Then, by removing the tungsten film 142a, the barrier metal film, 140a, the second bottom, barrier film, 138a and the first bottom barrier film 137a formed on the third insulating layer 133 by the use of a CMP method, the contact plug 145 and the wirings 165 that are integrated into one unit are formed.

Thereafter, by forming a protective layer to cover and protect the upper surface of the wirings 165 in the same manner as in the first embodiment, a semiconductor device is completed In the same manner as in the first embodiment, the present embodiment also realizes the high reliability of the semiconductor device and the low resistance of the contact plug.

In addition, the present embodiment makes it possible to form the contact plug and the wirings by using the same process, and consequently to reduce the number of manufacturing processes and the costs.

Figure 17:
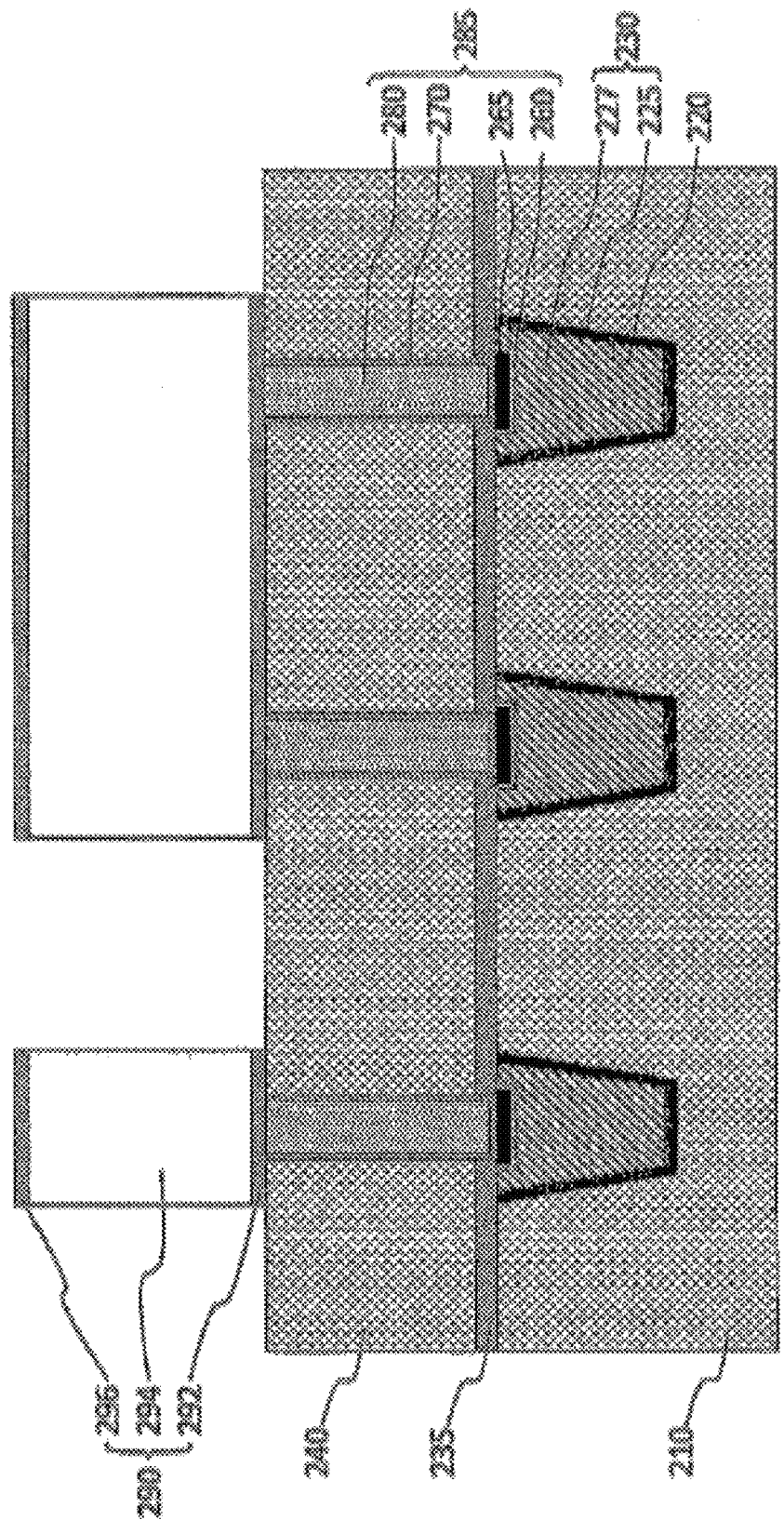
FIG. 17 is a cross-sectional view of still another embodiment of a semiconductor device structure of the present invention.

Next, referring to FIG. 17, the following description will discuss a semiconductor device in accordance with a third embodiment of the present invention.

In the first and second embodiments, explanations have been given by exemplifying a semiconductor device having a structure in which a contact plug is formed on a silicide layer; however, in the present embodiment, explanations will be given by exemplifying a semiconductor device having a structure in which a contact plug is formed on copper wiring.

FIG. 17 is a cross-sectional view showing one portion of a multi-layer wiring included in the semiconductor device relating to the present embodiment.

On a first inter-metal dielectric layer 210 serving as a low-k film (for example, silicon oxycarbide), a plurality of wiring grooves 220 are formed, and inside each of the wiring grooves 220, a metal (copper) wiring 230 made of a wiring barrier layer 225 (for example, a stacked film of tantalum and tantalum nitride) and a metal wiring layer 227 is formed.

A protective layer 235 (for example, silicon carbonitride) is formed on the first inter-metal dielectric layer 210, and the upper surface of copper wiring 230 is covered, with the protective layer 235. Moreover, a second inter-metal dielectric layer 240 (for example, layer comprising silicon dioxide) is formed on the protective layer 235.

A contact plug 285 that penetrates the second inter-metal dielectric layer 240 and the protective layer 235 to reach copper wiring 230 is formed. The contact plug 285 can be formed by using the same processes as those of the first embodiment.

More specifically, the contact plug 285 includes a first bottom barrier film 260 (for example, titanium) made in contact with copper wiring 230, a second bottom barrier film 265 (for example, titanium nitride) formed thereon, a barrier metal (for example, tungsten nitride) 270 covering the upper surface of the second bottom barrier film 265 and the side faces of the second inter-metal dielectric layer 240, and a contact plug main body 280 (for example, tungsten) that buries an inner space specified by the barrier metal 270.

Additionally, in the present embodiment, different from the first and second embodiments, since the lower conductive layer is made of not nickel silicide, but copper, titanium oxide film may be used as the first bottom barrier film 260. Titanium oxide film can be formed by processes in which, after forming titanium film, an annealing process is carried out thereon in an oxygen atmosphere. By using titanium oxide film, it is possible to improve a barrier performance for preventing copper from dispersing onto the contact plug main body 280.

On the second inter-metal dielectric layer 240, an upper wiring layer 290 to be connected to the contact plug 285 is formed. The upper wiring layer 290 includes a base barrier layer 292 (for example, titanium nitride), a wiring layer 294 (for example, made of aluminum, an alloy comprising aluminum, or an Al—Cu alloy) and an anti-reflection layer (for example, titanium nitride) 296.

In the same manner as in the first and second embodiments, the present embodiment makes it possible to realize the improvement of the reliability of the semiconductor device and the lowering of the electric resistance of the contact plug.

Although the present invention has been explained by reference to some preferred embodiments, the present invention is not intended to be limited by the above-mentioned embodiments, and modifications and alternations may be made therein within the range of the gist of the present invention.

What is claimed is:

1. A semiconductor device comprising:
   a contact plug including an upper surface, a lower surface and a side surface extending between the upper and lower surfaces, the contact plug comprising tungsten;
   a barrier metal comprising tungsten nitride and covering the side surface and the lower surface of the contact plug, the barrier metal having an upper surface that is coplanar with the upper surface of the contact plug;
   a first conductive layer; and
   a barrier layer comprising titanium and intervening between the barrier metal and the first conductive layer.

2. The semiconductor device according to claim 1, wherein the barrier layer includes first and second portions, the first portion comprising titanium, the second portion comprising titanium nitride, the second portion intervening between the first portion and the barrier metal.

3. The semiconductor device according to claim 2, further comprising an insulating layer laterally surrounding the barrier metal.

4. The semiconductor device according to claim 2, further comprising a second conductive layer formed on the upper portion of the contact plug.

5. The semiconductor device according to claim 4, wherein the first conductive layer includes a metal silicide layer, the metal silicide layer comprising at least one of titanium silicide, cobalt silicide, nickel silicide, and platinum silicide.

6. The semiconductor device according to claim 4, wherein the first conductive layer comprises a copper layer.

7. The semiconductor device according to claim 4, wherein the second conductive layer comprises a copper layer.

8. The semiconductor device according to claim 4, wherein the second conductive layer comprises an aluminum layer.

9. The semiconductor device according to claim 2, wherein the contact plug contains boron.

10. The semiconductor device according to claim 2, wherein the first portion further comprises oxygen.

11. A semiconductor device comprising:
    a lower conductive layer;
    an insulating layer over the lower conductive layer, the insulating layer including a hole selectively formed therein to expose a part of the lower conductive layer;
    a contact plug formed in the hole, the contact plug comprising tungsten;
    a first barrier layer formed on the part of the lower conductive layer;
    a second barrier layer formed on the first barrier layer; and
    a barrier metal inserted between the second barrier layer and the contact plug, the barrier metal being in direct contact with the contact plug and having an upper surface that is coplanar with an upper surface of the contact plug.

12. The semiconductor device according to claim 11, wherein the first barrier layer comprises titanium and the second barrier layer comprises titanium nitride.

13. The semiconductor device according to claim 12, wherein the barrier metal comprises tungsten nitride.

14. The semiconductor device according to claim 13, wherein the lower conductive layer comprises a metal silicide.

15. The semiconductor device according to claim 14, wherein the metal silicide contains at least one of titanium, cobalt, nickel, and platinum.

16. The semiconductor device according to claim 13, wherein the lower conductive layer comprises copper.

* * * * *